(12) United States Patent
Towler et al.

(10) Patent No.: US 6,697,277 B2
(45) Date of Patent: Feb. 24, 2004

(54) CONTENT ADDRESSABLE MEMORY (CAM) HAVING A MATCH LINE CIRCUIT WITH SELECTIVELY ADJUSTABLE PULL-UP IMPEDANCES

(75) Inventors: Fred J. Towler, Essex Junction, VT (US); Reid A. Wistort, Westford, VT (US); Jason Rotella, Mineville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/421,963

(22) Filed: Apr. 23, 2003

(65) Prior Publication Data

US 2003/0198071 A1 Oct. 23, 2003

Related U.S. Application Data

(62) Division of application No. 09/922,893, filed on Aug. 6, 2001, now Pat. No. 6,618,279.

(51) Int. Cl.⁷ ................................................ G11C 15/00
(52) U.S. Cl. ..................... 365/49; 365/189.11; 365/203
(58) Field of Search .............................. 365/49, 189.05, 365/189.11, 203

(56) References Cited

U.S. PATENT DOCUMENTS

| | | | |
|---|---|---|---|
| 4,694,425 A | 9/1987 | Imel | 365/49 |
| 5,396,449 A | 3/1995 | Atallah et al. | 365/49 |
| 5,528,541 A * | 6/1996 | Ghia et al. | 365/203 |
| 5,598,115 A | 1/1997 | Holst | 326/119 |
| 5,666,078 A | 9/1997 | Lamphier et al. | 327/108 |
| 5,740,097 A | 4/1998 | Satoh | 365/49 |
| 5,949,696 A | 9/1999 | Threewitt | 365/49 |
| 6,147,891 A | 11/2000 | Nataraj | 365/49 |
| 6,166,939 A * | 12/2000 | Nataraj et al. | 365/49 |
| 6,373,738 B1 | 4/2002 | Towler et al. | 365/49 |

* cited by examiner

Primary Examiner—Richard Elms
Assistant Examiner—J. H. Hur
(74) Attorney, Agent, or Firm—Robert A. Walsh; Cantor Colburn LLP (57) ABSTRACT

A match line circuit in a content addressable memory (CAM) has a match line coupled to a first pull-up device and a first pull-down device at a match node. The first pull-up device has selectively adjustable pull-up impedances associated with it. The match line circuit also includes a second pull-up device coupled to a second pull-down device at a float node, and an enabling signal for activating the match line circuit during a memory comparison operation. The enabling signal precharges the match node to a logic low level and the float node to a logic high level in between memory comparison operations.

7 Claims, 6 Drawing Sheets

CONTENT ADDRESSABLE MEMORY (CAM) HAVING A MATCH LINE CIRCUIT WITH SELECTIVELY ADJUSTABLE PULL-UP IMPEDANCES

This application is a division of application Ser. No. 09/922,893 filed Aug. 6, 2001, now U.S. Pat. No. 6,618,279.

BACKGROUND

The present invention relates generally to integrated circuit memory devices and, more particularly, to a method and apparatus for automatically adjusting the pull-up margin of a match line circuit used in conjunction with a content addressable memory (CAM).

A content addressable memory (CAM) is a storage device in which storage locations are identified by their contents, not by names or positions. A search argument is presented to the CAM and the location that matches the argument asserts a corresponding match line. One use for such a memory is in dynamically translating logical addresses to physical addresses in a virtual memory system. In this case, the logical address is the search argument and the physical address is produced as a result of the dynamic match line selecting the physical address from a storage location in a random access memory (RAM). CAMs are also frequently used for Internet address searching.

Figure 1:
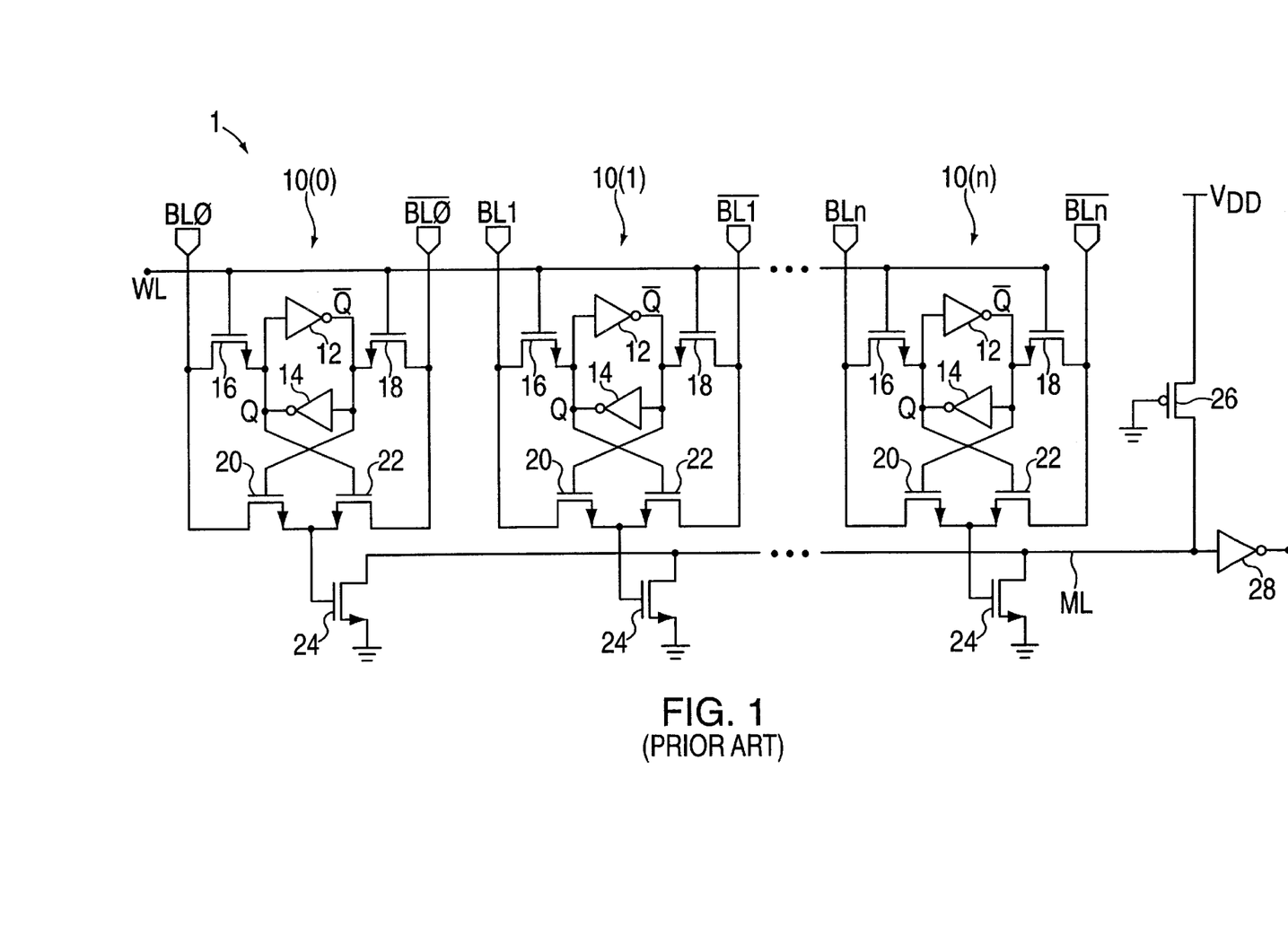
FIG. 1 is a schematic diagram of a CAM cell array configured to an existing match line circuit having a single pull-up device.

A conventional CAM array 1 having n-bit words is shown in FIG. 1 to include a row of n CAM cells 10 coupled to an associated word line WL. Each CAM cell 10 includes a latch, formed by CMOS inverters 12 and 14, for storing a bit of data. Opposite sides of the latch are coupled to associated complementary bit lines BL and BL bar via pass transistors 16 and 18, respectively, where each transistor has a gate coupled to the associated word line WL. The output terminal of the inverter I2 is coupled to the gate of an NMOS pass transistor 20, and the output terminal of the inverter I4 is coupled to the gate of an NMOS transistor 22. Transistor 20 is coupled between the associated bit line BL and the gate of an NMOS pull-down transistor 24, and transistor 22 is coupled between the associated complementary bit line BL bar and the gate of pull-down transistor 24. Pull-down transistor 24 is coupled between ground potential and a match line ML associated with the CAM word formed by the cells 10. A PMOS pull-up transistor 26 is coupled between a supply voltage $V_{DD}$ and the match line ML.

In the configuration of FIG. 1, the pull-up transistor 26 has a gate tied to ground potential and, therefore, remains in a conductive state. A conventional buffer 28 is coupled in series between the match line and an associated sensing circuit (not shown). During compare operations, the word line WL associated with the CAM word is grounded to turn off the pass transistors 16 and 18 associated with each CAM cell 10. Comparand bits to be compared with the data bits Q stored in the CAM cells 10 are provided to the associated bit lines BL, while the respective complements of the comparand bits are provided to the associated complementary bit lines BL bar. For each CAM cell 10, if the comparand bit matches the data bit Q stored therein, the gate of the corresponding pull-down transistor 24 is driven with a logic low signal via transistors 20 or 22, thereby maintaining the pull-down transistor 24 in a non-conductive state. If, on the other hand, the comparand bit does not match the data bit Q stored in the CAM cell 10, the gate of the corresponding pull-down transistor 24 is driven with a logic high signal via transistors 20 or 22, thereby turning on the pull-down transistor 24. When conductive, the pull-down transistors 24 pull the match line toward ground potential.

Thus, if just one of the comparand bits do not match their corresponding data bits Q stored in the CAM cells 10, the match line ML will be pulled to a logic low state (i.e., ground potential). Conversely, if all of the comparand bits match their corresponding data bits Q, the match line ML remains at the supply voltage $V_{DD}$ (i.e., a logic high state). In response to the voltage level on the match line ML, the buffer 28 provides to an associated sense circuit (not shown) an output signal indicative of whether all bits of the comparand word match all corresponding bits of the CAM word.

One disadvantage of the above described CAM configuration results from the fact that during a standby mode, DC current will flow through the match line circuit unless the bitline nodes (BL, BL bar) are precharged low. Otherwise, the path to ground potential results in significant power dissipation which, in turn, undesirably increases as the size and/or density of the CAM increases. On the other hand, the use of additional circuitry to precharge the bitline pairs also have negative impacts on device size and cost.

BRIEF SUMMARY

The above discussed and other drawbacks and deficiencies of the prior art are overcome or alleviated by a method for determining a desired operating impedance for a computer memory circuit, the computer memory circuit having a plurality of discrete, selectively adjustable impedance values associated therewith. In an exemplary embodiment of the invention, the method includes applying, to a reference circuit, a test impedance value to a reference circuit. The test impedance value is controlled by a binary count. A determination is made, based upon the applied test impedance value, whether the reference circuit is in either a first state or a second state. The binary count is incremented if the reference circuit is in the first state and decremented if the reference circuit is in the second state. A condition is determined in which the reference circuit oscillates between the first state and said second state, and a pair of binary count values is stored. One of the binary count values represents a first impedance value which causes the reference circuit to change from the first state to the second state, and the other binary count value represents a second impedance value which causes the reference circuit to change from the first state to the second state. The desired operating impedance for the computer memory circuit corresponds to the lower of the stored pair of binary count values.

In a preferred embodiment, the lower of the stored pair of binary count values is adjusted by subtracting a predetermined, fixed value therefrom so as to create a buffered count. The buffered count is then used in applying the desired operating impedance to the operating circuit.

BRIEF DESCRIPTION OF THE DRAWINGS

Referring to the exemplary drawings wherein like elements are numbered alike in the several Figures.

DETAILED DESCRIPTION

Figure 2:
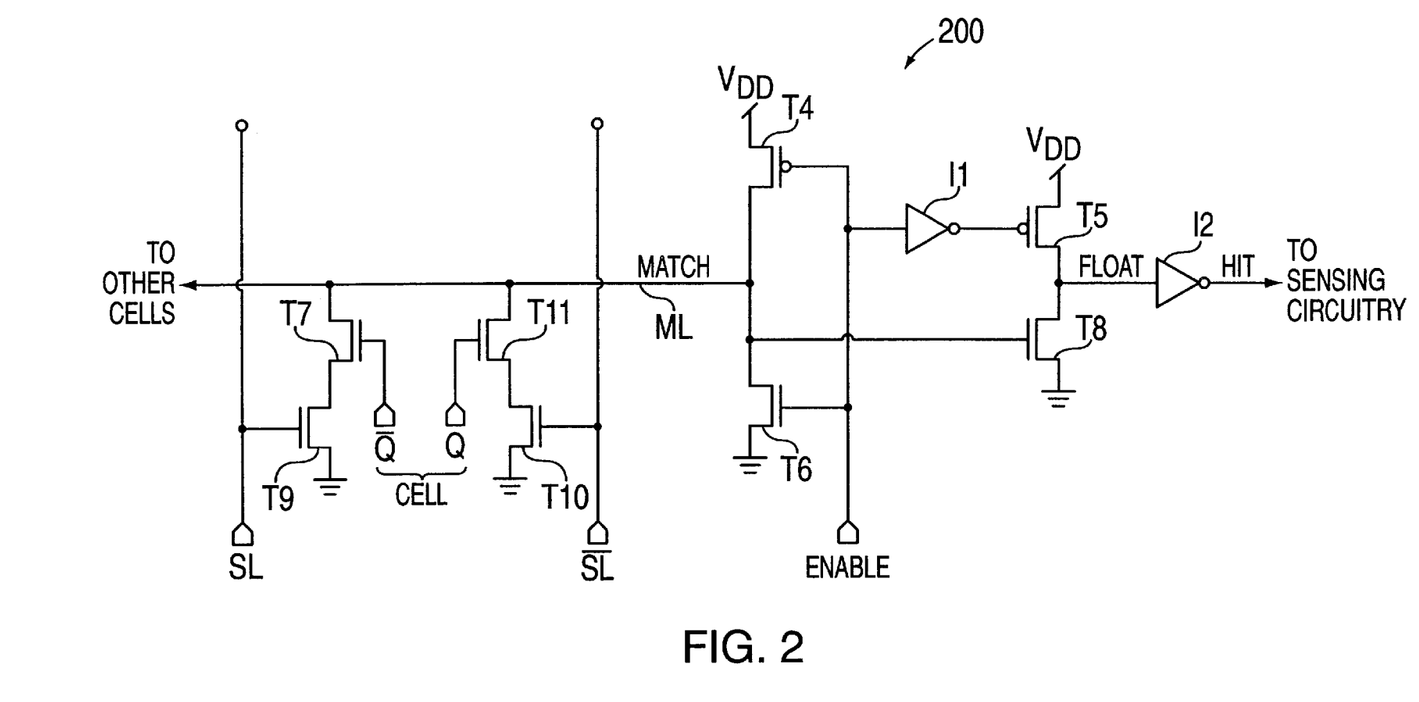
FIG. 2 is a schematic diagram of a low-power match line circuit which may be implemented as an alternative to the circuit of FIG. 1.

Referring initially to FIG. 2, there is shown a schematic diagram of one possible embodiment of a low-power, match line circuit 200 for a CAM sense amplifier. Match line circuit 200 replaces pull-up PFET 26 and buffer 28 of FIG. 1. For ease of description, only one CAM cell is depicted in FIG. 2. Match line circuit 200 includes pull-up PFET T4 coupled to a voltage supply $V_{DD}$ and a pull-down NFET T6 connected to ground. The gates of both T4 and T6 are coupled to an ENABLE signal which is initially biased at logic high (e.g., at $V_{DD}$ potential) and which goes to logic low (e.g., at ground potential) during a search or compare operation. In addition, the drains of T4 and T6 are coupled to match line ML and thereby define a node labeled MATCH in FIG. 2.

The ENABLE signal is also coupled to an inverter I1 which, in turn, has an output thereof connected to the gate of pull-up PFET T5. Another pull-down NFET T8 has its drain connected to the drain of T5, thereby defining a node labeled FLOAT, which is described in further detail hereinafter. The gate of T8 is further connected to the MATCH node. Finally, a second inverter I2 has an input connected to the FLOAT node and an output which defines a node labeled HIT.

The operation of the match line circuit 200 is understood with reference to the following description. In between search (compare) operations, ENABLE is biased at logic high, as stated earlier. Thus, NFET T6 is rendered conductive, pulling MATCH to ground. As a result, SL and SL bar may remain in their previous state, thereby eliminating the power required to precharge them. Further, the conductive state of T6 prevents any DC current flowing during a standby mode. This is in contrast to the circuitry shown in FIG. 1, wherein the match line is biased to $V_{DD}$ prior to a data comparison operation, and BLIBL bar must be switched to ground in order to eliminate a DC path.

It will also be noted that, prior to a search operation, the output of I1 is low, thereby rendering PFET T5 conductive and charging FLOAT to $V_{DD}$ (since T8 is switched off by the bias on MATCH). The output of inverter I2, therefore is low, and there is no "hit signal" on HIT.

During a search, ENABLE is switched to low and a comparand data bit (with associated complement) is applied to the array cell through search lines SL and SL bar. Once ENABLE goes low, T6 is turned off and T4 is rendered conductive, attempting to pull MATCH up toward logic high. In the meantime, the output of inverter I1 switches from low to high, thereby turning off T5 and causing the FLOAT node to "float" at a high voltage (until such time as T8 might become conductive). So long as FLOAT remains charged high, the output at HIT will remain low, signifying a data match has not yet occurred.

In the event that a data match occurs (i.e., each bit in the stored CAM word matches each corresponding bit in the comparand word), none of the pull-down NFETs associated with each cell will be activated and thus will not prevent T4 from pulling MATCH up toward high. During this time, the voltage at MATCH will rise asymptotically to a voltage level determined by the relative strengths of T4 and the pull-down NFETs in the cells. Once the voltage level at MATCH reaches the threshold value of T8, T8 will turn on and discharge FLOAT to ground. In turn, HIT will then be switched from low to high by inverter I2, thereby signaling a data match.

However, if one or more of the comparand data bits do not match the corresponding stored data bits, there will be at least one pull-down NFET opposing the pull-up of T4. Accordingly, the voltage value at MATCH will be kept below the threshold value of T8 so as not to discharge FLOAT and falsely indicate a hit (data match) condition. In the case of a "marginal miss" scenario where there is only one mismatched bit (and thus only one pull-down path activated), the conductivity of T4 could be just strong enough so as to overcome the pull-down of the lone mismatched cell and pull MATCH all the way up to the threshold of T8, thereby triggering a false match. Such a condition is not out of the realm of possibility, given the real world of process variations, inaccurate device models and unpredictable operating conditions. Thus, T4 is designed to be a weak pull-up PFET.

On the other hand, the weaker the pull-up device used, the longer the time it takes for the device to perform its intended function. Since speed is an important consideration in the design of integrated circuit devices, it is therefore desirable to have a match line circuit for a CAM sense amplifier featuring a pull-up device strong enough to avoid a speed penalty while not allowing the asymptotic match line voltage to reach the threshold voltage $(V_t)$ of the pull-down transistor T8 during a "marginal miss". Unfortunately, this can be a difficult proposition by using a single transistor (T4) as the pull-up device.

Therefore, in accordance with an embodiment of the invention, a self-adjusting margin circuit for a CAM sense amplifier is disclosed, which provides automatic control of the margin between the asymptotic MATCH node voltage and the NFET $V_1$. A preferred approach is to employ a PFET device having a controllable, adjustable pull-up strength responsive to actual operating conditions.

Figure 3:
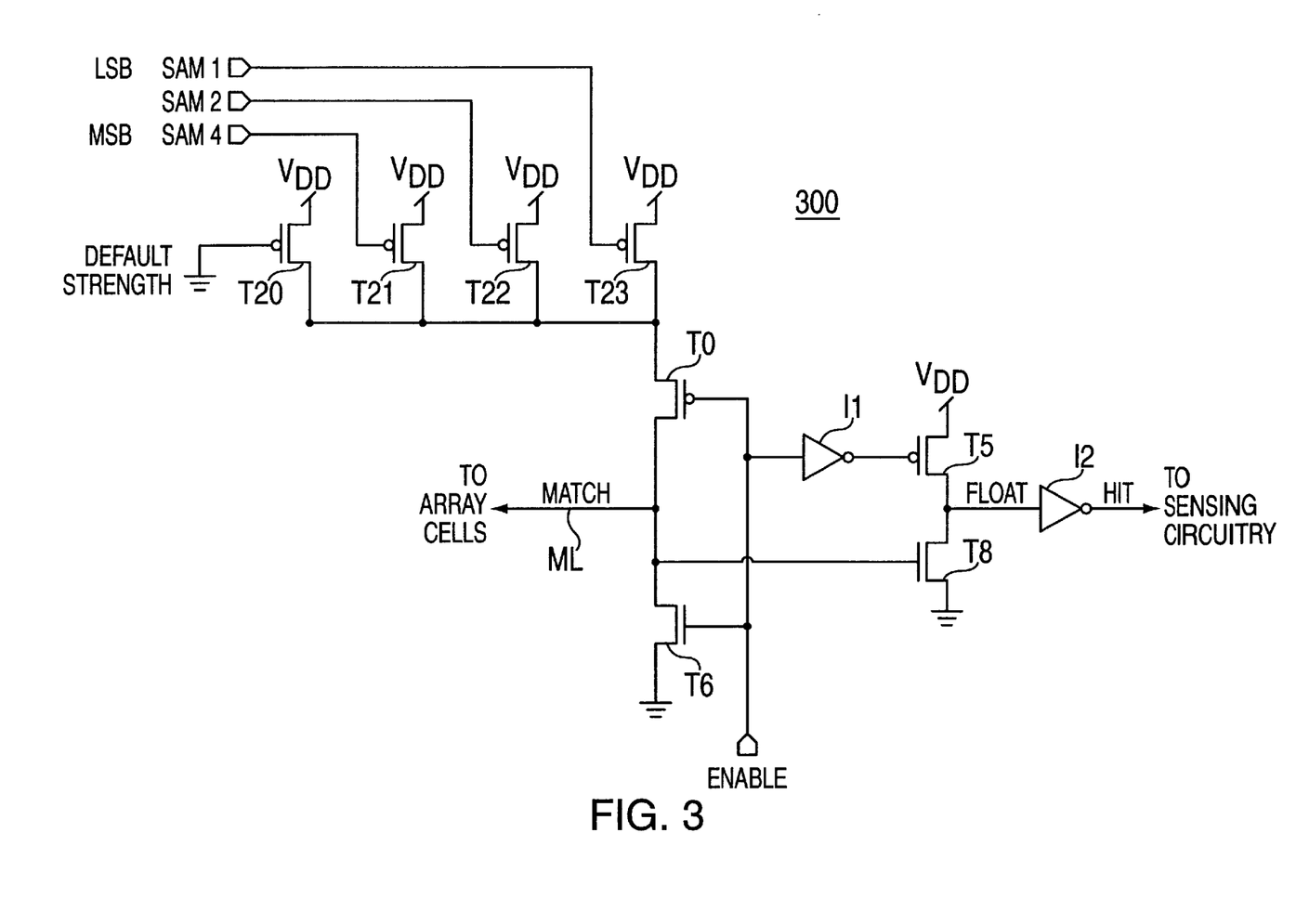
FIG. 3 is a schematic diagram of a low-power match line circuit having a self-adjusting pull-up margin, in accordance with an embodiment of the invention.

Referring now to FIG. 3, there is shown an improved match line circuit 300 for use in a CAM array. For ease of description, like or equivalent circuit components in circuit 300 are given the same reference designations as in FIG. 2. In circuit 300, pull-up PFET T4 (FIG. 2) has been replaced by PFET T0, as well as a parallel group of PFETs T20, T21, T22 and T23 connected thereto. T0 acts as a switch which enables T20–T23, in combination, to determine the specific impedance (and thus the strength) of the pull up path. PFET T20 remains conductive since the gate thereof is connected to ground, thereby defining a "default" or minimum strength pull-up value for circuit 300. The remaining PFETs T21, T22 and T23 are selectively activated by DC control signals SAM 4, SAM 2 and SAM 1, respectively, which control signals determine a discrete value for the pull-up path impedance.

Figure 4:
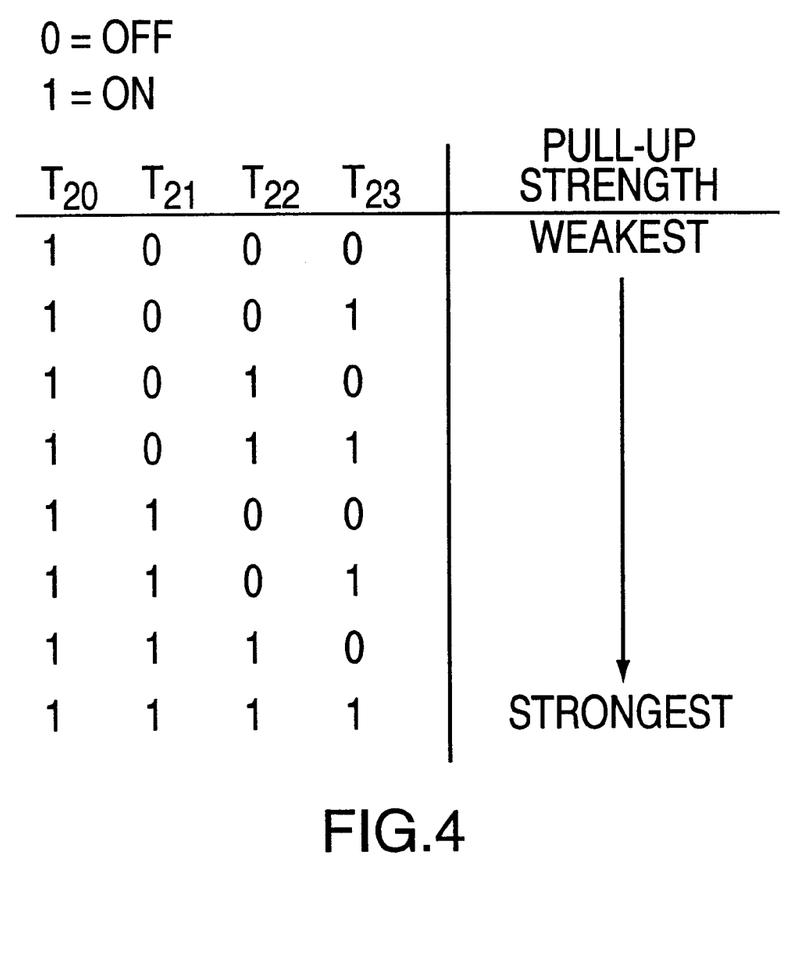
FIG. 4 is a truth table which illustrates the relative pull-up strength combinations of the pull-up devices shown in FIG. 3.

Control signals SAM 4, SAM 2 and SAM 1, collectively, may be thought of as a three-bit binary word whose value is proportional to the overall pull-up strength of circuit 300. The PFET device characteristics are chosen such that SAM1 is the least significantly weighted bit and SAM 4 is the most significantly weighted bit. FIG. 4 is a truth table illustrating the resulting device pull-up strength versus the specific combination of activated PFETs. As can be seen, the pull-up strength is minimum with only default PFET T20 being conductive and maximum when all four PFETs are conducting.

It should be understood that the "1" and "0" representations shown in the truth table of FIG. 4 represent the conductive state of the PFETs and not the logic level of the voltage applied to the gates thereof. In other words, first entry in the table (1, 0, 0, 0) signifies that T21, T22 and T23 are each switched off, not that the inputs on control signals SAM 4, SAM 2 and SAM 1 are all "low" or "logic 0". On the contrary, because these devices are PFETs, the voltage inputs on control signals SAM 4, SAM 2 and SAM 1 would actually be high (e.g., $V_{DD}$) to render them non-conductive.

Although in the presently disclosed embodiment a three-bit word is used to provide eight discrete pull-up impedance values, it will be understood that additional binary-weighted transistors may be used to provide a finer range of incremental values.

Given the range of adjustable pull-up impedances provided by circuit 300, the next task then becomes one of dynamically controlling the PFETs (T21, T22 and T23) such that a specific desired pull-up impedance is achieved in view of possible variations in process conditions and operating conditions. Again, it is desired to use the highest pull-up strength which is also within an acceptable range so as not to create false hit indications.

Figure 5:
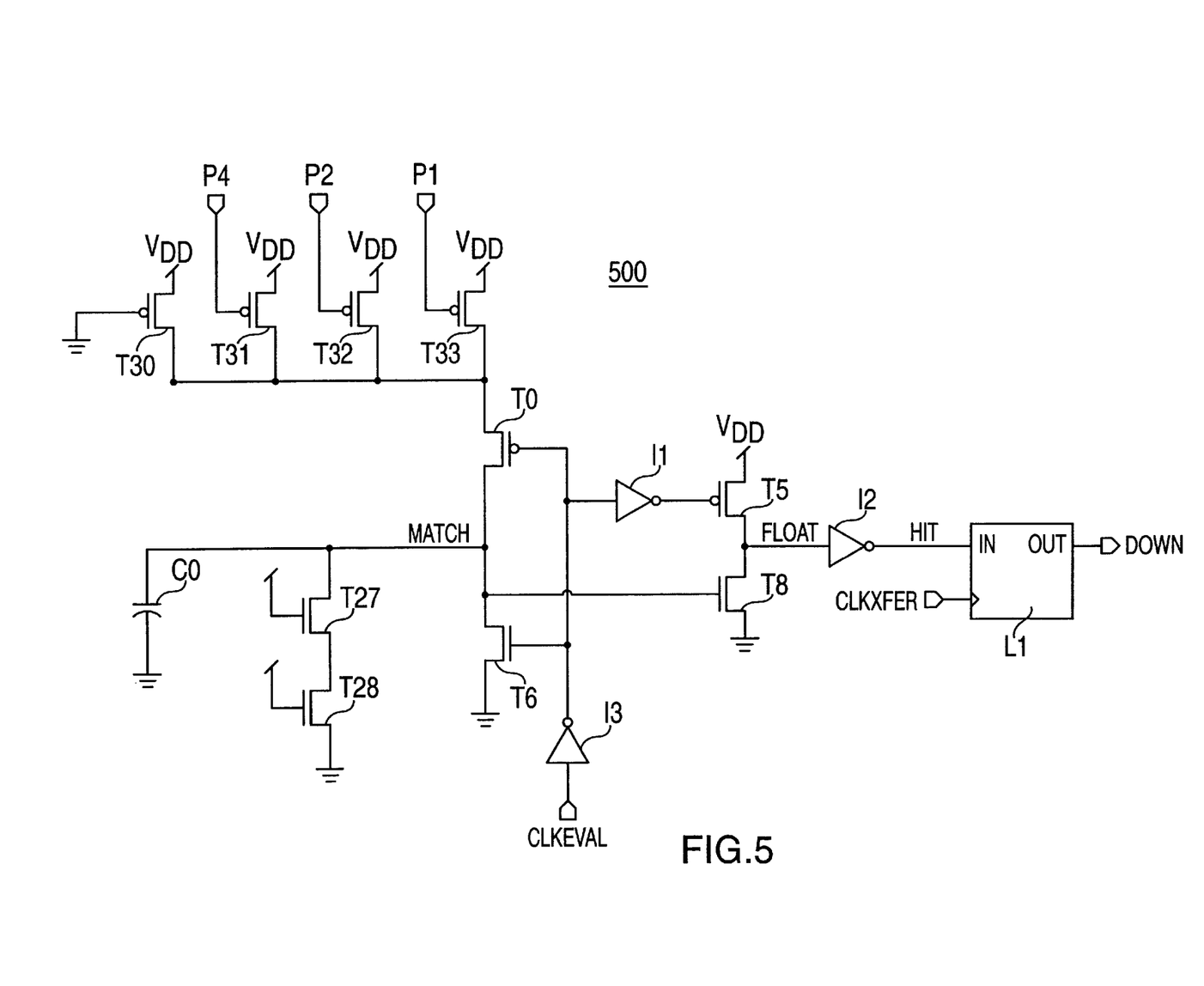
FIG. 5 is a schematic diagram of a reference circuit used in conjunction with the circuit shown in FIG. 3, in accordance with an embodiment of the invention.

Accordingly, FIG. 5 illustrates a reference circuit 500 which features devices substantially similar to those included within circuit 300, and which are preferably formed upon the same chip as circuit 300 and the CAM array. However, in contrast to a plurality of circuits 300 associated with the CAM array cells, there need only be a single reference circuit 500. In effect, reference circuit 500 is used as a "dummy" or test circuit which is self-adjusting so as to determine a desired impedance strength for the pull-up devices included in the actual operating match line circuits 300.

As with circuit 300, reference circuit 500 includes a plurality of parallel connected PFET pull-up transistors labeled T30, T31, T32 and T33, which are analogous to T20, T21, T22 and T23. T30, having its gate connected to ground, provides a minimum pull-up strength value for reference circuit 500. Similar to circuit 300, the selectively adjustable PFETs T32, T32 and T33 are controlled by input signals P4, P2 and P1 which comprise a three bit binary word. The values of P4, P2 and PI are driven from latches in a counter, described in greater detail hereinafter.

Because reference circuit 500 is not physically connected to a CAM array, but is instead used in conjunction with a "simulated" CAM array, a dummy capacitive load C0 is connected thereto. The capacitive load C0 is intended to make the MATCH node capacitance look like a "real" match node having several capacitive loads coupled therewith. In addition, NFETs T27 and T28 provide a constant pull-down path which will continuously simulate a "marginal miss" condition where there is only a single CAM cell providing a pull-down path.

In operation, reference circuit 500 performs essentially the same function as the circuits 300 used in the CAM arrays. Instead of being activated by the ENABLE signal, reference circuit 500 is triggered by the rising edge of a clock signal CLKEVAL (described in additional detail later). Recalling that the operation of circuit 300 is triggered by ENABLE going from high to low, an inverter I3 is connected to CLKEVAL in reference circuit 500. Thus, when CLKEVAL rises the PFET network will be enabled, attempting to pull the MATCH node up to its asymptotic voltage.

If the initial value of the PFET pull-up strength (provided by T30, T31, T32 and T33) is not too strong, FLOAT will not be discharged and, if too strong, FLOAT will be discharged. Since the primary purpose of reference circuit 500 is to determine the counter value (P4, P2, P1) which provides the strongest pull-up value that will not discharge FLOAT, the next highest pull-up value that does discharge FLOAT should also be determined. Accordingly, the HIT node of reference circuit 500 is further coupled to a latch L1 which latches the result of an evaluation upon the triggering of clock signal CLKXFER. The output of latch L1 is a signal labeled DOWN, which signal thus controls the direction of the counter.

By way of example, it will be assumed that the maximum pull-up strength of reference circuit 500 (which does not result in FLOAT being discharged) corresponds to the binary word value <101> applied to inputs P4, P2 and P1. Reference circuit 500 will determine this value by having the input values of P4, P2 and P1 automatically adjusted until the oscillation point is found, regardless of the initial setting of P4, P2 and P1. Thus, if upon the initial evaluation, the PFET strength is too strong, this will be reflected by the latch DOWN signal, and the binary value applied to P4, P2 and P1 is decremented by one bit for this evaluation. This will continue until FLOAT is not discharged, and then the binary value will be incremented by one bit for the next evaluation.

Continuing with the above example, the following is a table which illustrate one possible sequence of reference circuit evaluations (iterations) performed. Again, it will be assumed in this example that the maximum pull-up strength resides at input value <101> and that the initial value on the counter applied to P4, P2 and P1 is <000>:

| Counter Value | FLOAT | DOWN signal result |
| --- | --- | --- |
| 000 | charged | increment by one |
| 001 | charged | increment by one |
| 010 | charged | increment by one |
| 011 | charged | increment by one |
| 100 | charged | increment by one |
| 101 | charged | increment by one |
| 110 | discharged | decrement by one |
| 101 | charged | increment by one |
| 110 | discharged | decrement by one |

It will be seen in the above example that the reference circuit 500 has reached an equilibrium state where the float node is oscillating between charged and discharged where PFET pull-up strengths correspond to the 101 and the 110 values. Therefore, circuit 500 determined that the maximum PFET pull-up strength corresponds to the impedance value when T31 and T33 are conductive and T32 is off (T30 always being on). Reference circuit 500 will determine this point regardless of whether the initial value applied to P4, P2 and P1 is "too high" or "too low".

Equally as important is the fact that reference circuit 500 also allows for dynamic changes in maximum allowable PFET pull-up strength during circuit operation. For example, it may be that circuit temperature conditions result in the lowering of maximum allowable PFET pull-up strength. Thus, a continuation of the above table could look as follows:

| Counter Value | FLOAT | DOWN signal result |
|---|---|---|
| 110 | discharged | decrement by one |
| 101 | charged | increment by one |
| 110 | discharged | decrement by one |
| 101 | charged | increment by one |
| 110 | discharged | decrement by one |
| 101 | discharged | decrement by one |
| 100 | charged | increment by one |
| 101 | discharged | decrement by one |
| 100 | charged | increment by one |

As can be seen, the oscillation point has now been lowered such that new maximum allowable PFET pull-up strength corresponds to a <100> input at P4, P2 and P1.

Figure 6:
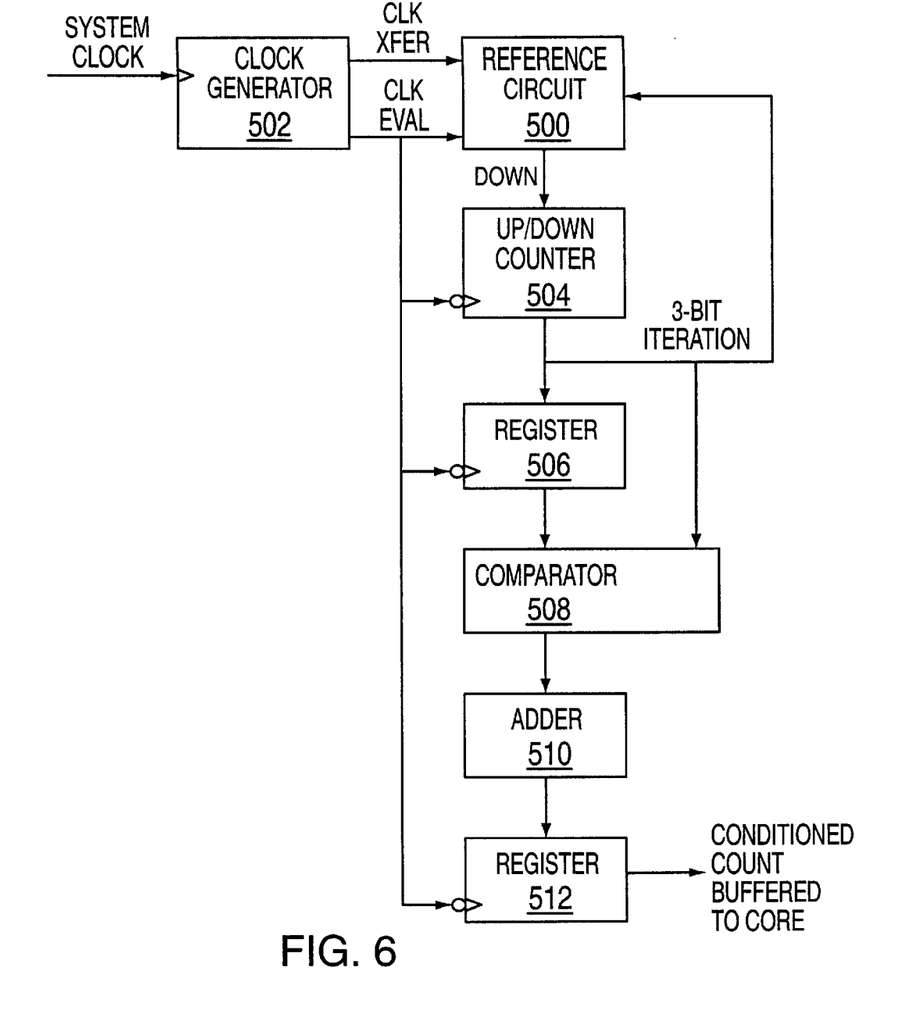
FIG. 6 is a block diagram illustrating functional relationship between the reference circuit of FIG. 5 and the circuit of FIG. 3, as well as the generation of a buffered count to be inputted to the circuit of FIG. 3.
Figure 7:
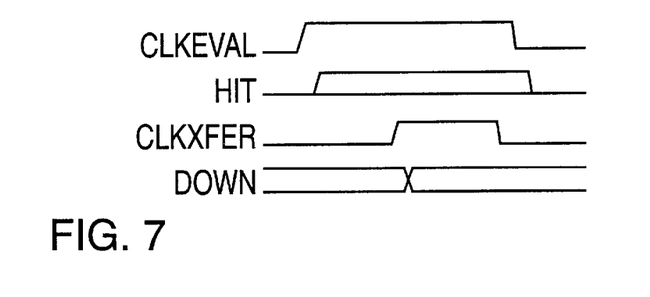
FIG. 7 is a timing diagram illustrating the interrelationship between external clock signals and signals generated by the reference circuit of FIG. 5.

Finally, FIG. 6 is a block diagram illustrating the generation of the counter value applied to reference circuit 500, as well as the interaction between the reference circuit 500 and the match line circuits 300 used in the CAM arrays. A clock generator 502 generates the clock signals CLKEVAL and CLKXFER (described above) sent to reference circuit 500. The rising edge of CLKEVAL begins an evaluation, while the falling edge of CLKEVAL latches the value of HIT and creates the DOWN signal. The interrelationship between the clock signals and the HIT and DOWN signals is illustrated in FIG. 7.

In a preferred embodiment, the clock generator 502 also comprises a clock divider therein such that the evaluation is performed every $64^{th}$ system clock cycle. In one aspect, it is assumed that any drifting in operating conditions is relatively slow as compared to the system clock rate. Additionally, a divide-by-64 clock generator helps to conserve power dissipated in the circuit. However, it should be understood that other clock divider ratios (e.g., divide-by-32) may also be implemented.

Referring once again to FIG. 6, it is seen that the DOWN signal generated within reference circuit 500 is sent to an up/down counter 504 which counts up or down by one bit, depending upon the directional value of DOWN. Upon receiving the clock signal CLKEVAL, up/down counter 504 generates the next three-bit count. This new count is then applied back to P4, P2 and P1 so that, in turn, an increased/decreased PFET pull-up strength is applied for the next evaluation.

At the same time, a first register 506 stores the new count, as well as the count from the previous evaluation. Then, a comparator 508 selects the lower value of the new count and the previous count to correctly identify which of the two stored counts represents the correct PFET pull-up value that does not cause a false hit indication. In effect, comparator 508 and first register 506 act as a filter, producing a stable count since the equilibrium count is oscillating by one (least significant) bit. Because the count identified by comparator 508 represents the maximum PFET pull-up strength allowed for correct CAM circuit operation, an adder 510 is used as a buffer margin. Adder 510 will then subtract a predetermined amount from the "optimal" count, thereby producing a "conditioned" or buffered count. This conditioned count is then stored in a second register 512 and is used to control the actual pull-up PFETs used in the match line circuitry.

The fixed value that the adder 510 subtracts from the count (determined by comparator 508) may be chosen based on experience with the system hardware and can be coded within fuses. Assuming, for example, that this fixed value is designed to be a subtraction by 1 bit, than an oscillating count (as in the above example) between <101> and <110> results in comparator 508 identifying <101> as the maximum pull-up strength. The adder 510 would then subtract one bit from this value to produce a conditioned count of <100>. Therefore, <100> is stored in second register 510 and then buffered to the CAM circuitry for use. It is preferred, however, that additional logic be added so that the conditioned count values supplied to the CAM core are not updated during a search operation.

To summarize, reference circuit 500, in combination with the above-described digital circuitry, provides a reference sense amplifier for a CAM device. The pull-up strength thereof is controlled by a counter that is self-adjusting in order to identify the maximum pull-up strength of a PFET device which will still allow the CAM to function correctly (i.e., no false hit indications). Once the maximum pull-up strength is identified, that value is reduced and buffered so that the actual pull-up value used in the CAM devices is close, but not "too close" to the maximum value. In the event that actual process conditions effect a shift in maximum pull-up strength, this will also be identified and compensated for.

Although the above disclosed invention embodiments have been in the context of content addressable memories, it will be appreciated that the principles herein may be applicable to other memory storage devices. Furthermore, these principles are equally applicable to other types of devices in general where it is desirable to automatically adjust the margin of operating impedances to compensate for process and dynamic operating conditions.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A match line circuit for use in a content addressable memory (CAM) device, comprising:

a first pull-up device, said pull-up device having selectively adjustable values of pull-up impedances associated therewith;

a first pull-down device;

a match line coupled to said first pull-up device and said first pull-down device, said match line further coupled to a plurality of CAM cells, thereby defining a match node there at;

a second pull-up device coupled to a second pull-down device, defining a float node there at; and enabling means for activating the match line circuit during a memory comparison operation;

wherein said enabling means causes said match node to be precharged to a logic low voltage level and said float node to be precharged to a logic high level in between memory comparison operations.

2. The match line circuit of claim 1, wherein:

said first pull-down device is conductive in between memory comparison operations, thereby precharging said match node to said logic low voltage level; and said second pull-up device is conductive in between memory comparison operations, thereby precharging said float node to said logic high voltage level.

3. The match line circuit of claim 2, wherein said first pull-up device further comprises:

a first pull-up transistor having a gate coupled to said enabling means;

a plurality of pull-up transistors, connected in parallel, said plurality of pull-up transistors capable of selectively being energized so as to provide said selectively adjustable values of pull-up impedances.

4. The match line circuit of claim 3, wherein said plurality of pull-up transistors are energized by a binary word, said binary word having a digital value corresponding to a desired pull-up impedance.

5. The match line circuit of claim 4, wherein:

during a memory comparison operation, said enabling means causes said first pull-up transistor to be conductive, and further causes said first pull-down device and said second pull-up device to be non-conductive.

6. The match line circuit of claim 4, wherein:

during a memory comparison operation, if a complete match exists between data bits stored in said plurality of CAM cells and comparand data bits applied to said plurality of CAM cells, then said first pull-up device causes said second pull-down device to discharge said float node, thereby indicating a data match condition.

7. The match line circuit of claim 6, wherein:

during a memory comparison operation, if a complete match does not exist between said data bits stored in said plurality of CAM cells and said comparand data bits applied to said plurality of CAM cells, then at least one pull-down device within said plurality of CAM cells prevents said first pull-up device from causing said second pull-down device to discharge said float node.

* * * * *